(12) United States Patent
Fischer

(10) Patent No.: US 11,821,074 B2
(45) Date of Patent: Nov. 21, 2023

(54) HIGH-FREQUENCY-TRANSPARENT COMPONENT AND METHOD FOR PRODUCING THE SAME

(71) Applicant: Bayerische Motoren Werke Aktiengesellschaft, Munich (DE)

(72) Inventor: Jonathan Fischer, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 192 days.

(21) Appl. No.: 17/312,222

(22) PCT Filed: Dec. 10, 2019

(86) PCT No.: PCT/EP2019/084348
§ 371 (c)(1),
(2) Date: Jun. 9, 2021

(87) PCT Pub. No.: WO2020/160815
PCT Pub. Date: Aug. 13, 2020

(65) Prior Publication Data
US 2022/0049344 A1    Feb. 17, 2022

(30) Foreign Application Priority Data

Feb. 4, 2019    (DE) .................... 10 2019 102 657.1

(51) Int. Cl.
*H01Q 1/42*    (2006.01)
*C23C 14/08*    (2006.01)
(Continued)

(52) U.S. Cl.
CPC ........ *C23C 14/081* (2013.01); *C23C 14/0015* (2013.01); *C23C 14/205* (2013.01);
(Continued)

(58) Field of Classification Search
CPC . C23C 14/081; C23C 14/0015; C23C 14/205; C23C 14/34; H01Q 1/3233; H01Q 1/42
See application file for complete search history.

(56) References Cited

U.S. PATENT DOCUMENTS

| 6,184,842 B1 | 2/2001 | Leinweber et al. |
| 2003/0072126 A1 | 4/2003 | Bhattacharyya |

(Continued)

FOREIGN PATENT DOCUMENTS

| CN | 1656034 A | 8/2005 |
| CN | 102637951 A | 8/2012 |

(Continued)

OTHER PUBLICATIONS

Soda, Y., et al., "Pt-Doped Al2O3 as Dissipative Gap-Material in Tape Heads", Industry Applications Society Annual Meeting, 2008. IAS '08. IEEE, Oct. 5, 2008, pp. 1-6, ISBN: 978-1-4244-2278-4, Piscataway, NJ, USA, XP031353838 (six (6) pages).

(Continued)

*Primary Examiner* — David E Lotter
(74) *Attorney, Agent, or Firm* — Crowell & Moring LLP

(57) ABSTRACT

The invention relates to a high-frequency-transparent component comprising: a main body (2) and a coating (3) consisting of metal-doped Al2O3 sputtered thereon, and to a method for producing said component.

8 Claims, 1 Drawing Sheet

(51) Int. Cl.
*C23C 14/00* (2006.01)
*C23C 14/20* (2006.01)
*C23C 14/34* (2006.01)
*H01Q 1/32* (2006.01)

(52) U.S. Cl.
CPC ........... *C23C 14/34* (2013.01); *H01Q 1/3233* (2013.01); *H01Q 1/42* (2013.01)

(56) References Cited

U.S. PATENT DOCUMENTS

| | | | |
|---|---|---|---|
| 2003/0224181 A1* | 12/2003 | Finley | C03C 17/3634 |
| | | | 428/432 |
| 2007/0098967 A1 | 5/2007 | Ido et al. | |
| 2014/0178659 A1 | 6/2014 | Wu et al. | |
| 2015/0122642 A1 | 5/2015 | Okamoto et al. | |
| 2015/0284837 A1 | 10/2015 | Kohlscheen | |
| 2016/0237549 A1 | 8/2016 | Hara et al. | |
| 2018/0254551 A1 | 9/2018 | Guretzky et al. | |
| 2019/0013576 A1* | 1/2019 | Mayer Pujadas | H01Q 1/422 |
| 2019/0055157 A1 | 2/2019 | Hagen et al. | |
| 2021/0291956 A1* | 9/2021 | Owings | C03C 17/366 |

FOREIGN PATENT DOCUMENTS

| | | |
|---|---|---|
| CN | 104302804 A | 1/2015 |
| CN | 105637112 A | 6/2016 |
| CN | 108698395 A | 10/2018 |
| DE | 10 2014 104 672 A1 | 10/2015 |
| EP | 2 484 850 B1 | 12/2016 |
| JP | 2008-24254 A | 2/2008 |
| WO | WO 2017/144822 A1 | 8/2017 |

OTHER PUBLICATIONS

Lin, S., et al., "Properties of Ti-doped Al2O3 thin films deposited by simultaneous RF and DC magnetron sputtering", Vacuum, vol. 107, Feb. 28, 2014, pp. 225-230, ISSN: 0042-207X, XP028865858 (six (6) pages).

Chinese-language Office Action issued in Chinese Application No. 201980070059.9 dated Sep. 21, 2022 with English translation (15 pages).

Chinese-language Office Action issued in Chinese Application No. 201980070059.9 dated Feb. 25, 2023 with English translation (12 pages).

International Search Report (PCT/ISA/210) issued in PCT Application No. PCT/EP2019/084348 dated Mar. 11, 2020 with English translation (five (5) pages).

German-language Written Opinion (PCT/ISA/237) issued in PCT Application No. PCT/EP2019/084348 dated Mar. 11, 2020 (seven (7) pages).

German-language Office Action issued in German Application No. 10 2019 102 657.1 dated Oct. 1, 2019 with partial English translation (12 pages).

Chinese-language Office Action issued in Chinese Application No. 201980070059.9 dated Jun. 15, 2023 with English translation (9 pages).

* cited by examiner

HIGH-FREQUENCY-TRANSPARENT COMPONENT AND METHOD FOR PRODUCING THE SAME

BACKGROUND AND SUMMARY OF THE INVENTION

The invention relates to a high-frequency-transparent component and a process for the production thereof and in particular a radar-transparent vehicle component.

Many sensors and mobile appliances with wireless communication functions are installed in motor vehicles. For these to be invisible to the customer, they are, for example, concealed behind outer skin components. Thus, for example, a radar device for measuring spacing is frequently concealed behind a front grille or a bumper bar lining of a motor vehicle. Sensors for key recognition are concealed in, for example, vehicle handles. GPS transmitters and receivers are, for example, integrated into fins.

The covering component should firstly be transparent to high-frequency waves, i.e. the waves should not be excessively damped, absorbed or reflected on passage through the component. Secondly, the components should have a visually appealing appearance. Here, it is particularly desirable to have surfaces which resemble metal.

The production of radio-wave-transparent layers having the appearance of chromium is already known. According to the document US 2016237549 A1, a thin chromium layer formed by using physical vapor deposition (PVD) is radar-transparent. The deposition of tin or indium as thin layers, likewise by using PVD, is known from the document EP 2484850 B1. Deposited in this way, the materials form island-like regions which are electrically separated from one another. At the island boundaries, radio waves can pass through. However, the color appearance of such PVD layers is restricted to an appearance of chromium.

In light of this background, it is an object of the present invention to provide a possible way of increasing the color variance of components which are transparent to high-frequency waves.

This object is achieved by the claimed invention.

A high-frequency-transparent component having a main element and a layer of $Al_2O_3$ which is sputtered thereon and is metal-doped is provided.

Furthermore, a process for producing a high-frequency-transparent component is provided. The process comprises the steps of provision of a main element and sputtering of a metal-doped $Al_2O_3$ layer onto the main element. The process is particularly useful and can be used for producing the component of the invention. In this respect, the technical effects and advantages described for the component likewise apply to the process.

According to embodiments of the invention, sapphire ($Al_2O_3$) is utilized as support material and is provided with metal doping. The invention makes use of the fact that such a layer can be formed without problems by sputtering and gives the component a metallic appearance without the transparency to high-frequency radiation being lost.

Here, the invention makes use of the fact that sapphire in the undoped state is an insulator. The correspondingly large band gap allows a greater latitude in doping than is, for example, the case when a semiconductor is used instead of sapphire as support material. This gives new opportunities for achieving a metal-like optical effect without the transparency of the component for high-frequency radiation and in particular for radar waves to be appreciably opacified. The high-frequency-transparent component is transparent to electromagnetic radiation in a frequency range from 400 MHz to 90 GHz and in particular in the radar-relevant range from 30 GHz to 90 GHz or from 70 GHz to 90 GHz. In this context, a component is considered to be high-frequency-transparent when at least 50% of the incident radiation can pass through the component. Conversely, this corresponds to a maximum one-way signal damping of 3 dB.

The sapphire layer having the metal doping may be formed by sputtering. Sputtering (also known as cathode atomization) is a vacuum coating process. In sputtering, atoms of a solid body (target) are dislodged by ion bombardment in a vacuum chamber and go over into the gas phase. The substrate to be coated, here the main element, on which the dislodged atoms of the target deposit and form a solid, thin layer is located in the vicinity of the target. In the present process, aluminum atoms and oxygen atoms and also atoms of the metallic dopant are thus dislodged from one or more targets and deposited as metal-doped $Al2O_3$ layer on the main element.

The sapphire layer or $Al2O_3$ layer is preferably doped and configured in such a way that the transmission attenuation of the component in a frequency range from 60 GHz to 90 GHz through this layer is altered by less than 0.1 dB. In other words, the transmission attenuation of the component with doped sapphire layer in said frequency range differs by less than 0.1 dB from the transmission attenuation of the component without this layer.

The sapphire layer may be doped with at least one metal. Here, the doping concentration is made low so that the electrical properties of the sapphire layer do not yet change appreciably. At the same time, the doping concentration should be made as high as possible in order to strengthen the metallic impression and the color depth. A good metallic color effect is obtained when, for example, doping occurs with a concentration in a range from $10^{16}$ $cm^{-3}$ to a maximum upper doping concentration. The maximum upper doping concentration is, for example, selected so that the surface resistance of the doped layer is at least 10 MOhm ($10^6$ OHM), as a result of which good transparency for high-frequency radiation is ensured.

Suitable metals for doping the sapphire layer are, for example, the elements Au, Ag, Cu, Ni, Pt or Ti. Various color shades, e.g. red, yellow, blue or brown shades, can be obtained using these elements. These elements are particularly suitable because of their atom size, which is similar to the atom size of the aluminum in the sapphire layer. However, other sputterable metals can in principle also be introduced as dopant into the sapphire layer. In a preferred embodiment, the sapphire layer is doped with only one of the elements Au, Ag, Cu, Ni, Pt or Ti. However, it is also possible for the sapphire layer to be doped with two or more of these elements in order to achieve further color effects, with the sum of the doping concentration of all elements then preferably being selected so that the surface resistance of the doped layer is at least 10 MOhm.

In order to obtain an attractive metallic appearance combined with good transparency for high-frequency radiation, it has been found to be advantageous for, in one embodiment, the thickness of the sputtered layer to be in a range from 25 nm to 100 nm.

The main element may be composed of a material which is transparent to the high-frequency radiation. The main element is preferably composed of a polymer. The main element can also be coated, e.g. with a bonding agent or base coat. The optical appearance, for example, of the component can be influenced further by choice of this layer. For example, a rough or smooth base coat can make the sapphire layer display a matte or glossy metallic appearance.

Furthermore, additional layers can be arranged on the doped sapphire layer. For example, a very thin surface coating layer can be arranged on top of the sapphire layer in order to alter and influence the color effect further. In addition or as an alternative, a transparent polymer layer can be provided as mechanical protection.

The vehicle is preferably a vehicle component. This can, for example, be a front skirt, a decorative strip or a covering. The component is particularly preferably a radar cover of a radar device of a vehicle.

Further advantages, features and details of the invention can be derived from the following description in which working examples of the invention are described in detail with reference to the drawings. Here, the features mentioned in the claims and in the description can in each case be important for the invention either alone or in any combination. If the expression "can" is used in this patent application, it indicates both the technical possibility and also the actual technical implementation.

Working examples are described below with the aid of the accompanying drawings.

DETAILED DESCRIPTION OF THE DRAWINGS

Figure 1:
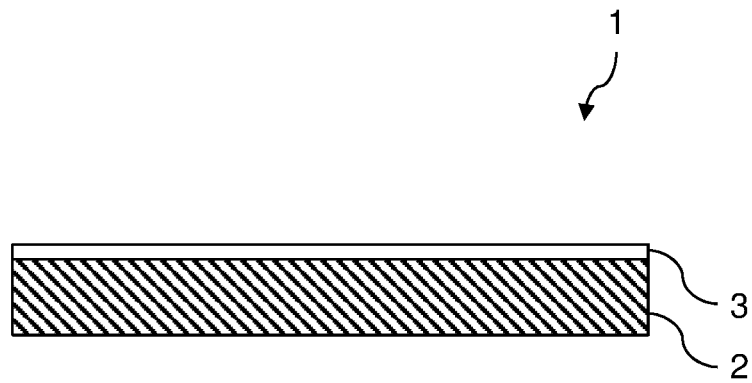
FIG. 1 shows a schematic sectional view of a first illustrative component.

FIG. 1 shows an illustrative high-frequency-transparent component 1 which forms, for example, a radar cover. The component 1 has a main element 2 which is composed of polymer. A sapphire layer which is doped with titanium (Ti:$Al_2O_3$) has been formed on this main element. This coating has been applied by sputtering and can preferably have a thickness in the range from 25 nm to 100 nm. The doping concentration of titanium in the sapphire layer can preferably be in a range from $10^{16}$ cm$^{-3}$ to a maximum upper doping concentration which is selected so that the surface resistance of the sapphire layer is still at least 10 MOhm.

As an alternative to doping with titanium, the sapphire layer can also be doped with another element or with more than one element from the group consisting of Au, Ag, Cu, Ni, Pt or Ti.

Figure 2:
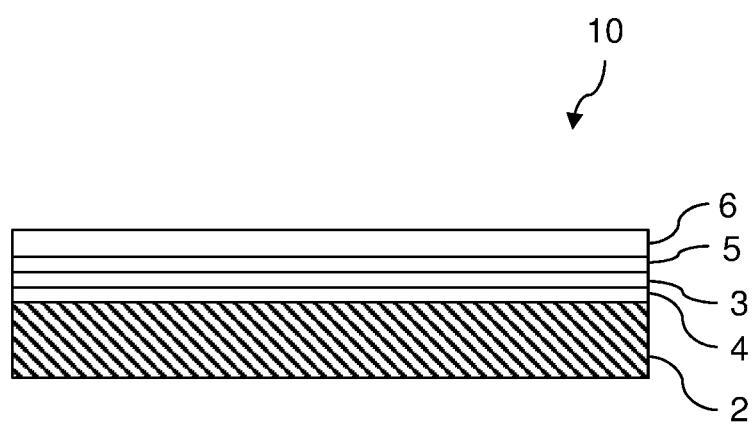
FIG. 2 shows a schematic sectional view of a second illustrative component.

FIG. 2 shows a further illustrative embodiment in which the same layers and components as in FIG. 1 are denoted by the same reference numeral and are not described again in order to avoid repetition.

In the example shown in FIG. 2, the component 10 comprises not only the main element 2 and the sapphire layer 3 but also further layers 4, 5 and 6. For example, a base coat which improves the adhesion of the sapphire layer deposited thereon has been applied directly on top of the main element 2. An additional color layer 5 to vary the color effect of the component and a polymer layer 6 as mechanical protection can in turn be arranged on top of the sapphire layer. It goes without saying that these layers can be provided in combination with one another or else only single or a plurality of layers of this type can be provided.

LIST OF REFERENCE NUMERALS 1, 10 Component
2 Main element
3 Metal-doped sapphire layer
4 Base coat
5 Color layer
6 Polymer layer

What is claimed is:

1. A high-frequency-transparent component comprising:
a main element; and
a layer comprising $Al_2O_3$ with metal doping, wherein the layer is sputtered on the main element,
wherein the layer is doped such that a transmission attenuation of the component in a frequency range from 60 GHz to 90 GHz is altered by less than 0.1 dB by the layer.

2. The component according to claim 1, wherein:
doping is carried out with a concentration in a range from a lower doping concentration to an upper doping concentration, and
the upper doping concentration is selected such that a surface resistance of the layer is at least 10 MOhm.

3. The component according to claim 1, wherein the metal doping is doping with at least one of Au, Ag, Cu, Ni, Pt or Ti.

4. The component according to claim 1, wherein a thickness of the layer is in a range from 25 nm to 100 nm.

5. The component according to claim 1, wherein the main element comprises a polymer.

6. The component according to claim 1, wherein the component is a vehicle component.

7. The component according to claim 1, wherein the component is a radar cover.

8. A process for producing a high-frequency-transparent component, the method comprising:
providing a main element; and
sputtering a metal-doped $Al_2O_3$ layer onto the main element,
wherein the layer is doped such that a transmission attenuation of the component in a frequency range from 60 GHz to 90 GHz is altered by less than 0.1 dB by the layer.

* * * * *